United States Patent
Kim

(10) Patent No.: US 9,865,662 B2
(45) Date of Patent: Jan. 9, 2018

(54) TRANSPARENT ORGANIC LIGHT EMITTING DISPLAY APPARATUS AND METHOD OF MANUFACTURING THE SAME

(71) Applicant: Samsung Display Co., Ltd., Yongin, Gyeonggi-Do (KR)

(72) Inventor: Jun-Young Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/804,996

(22) Filed: Jul. 21, 2015

(65) Prior Publication Data

US 2016/0260787 A1 Sep. 8, 2016

(30) Foreign Application Priority Data

Mar. 2, 2015 (KR) .................. 10-2015-0028881

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ........ *H01L 27/3246* (2013.01); *H01L 27/326* (2013.01); *H01L 51/0021* (2013.01); *H01L 51/5234* (2013.01)

(58) Field of Classification Search
CPC .............. H01L 27/3246; H01L 27/326; H01L 51/5234; H01L 51/5203; H01L 51/0021; H01L 51/524; H01L 27/32
See application file for complete search history.

(56) References Cited

U.S. PATENT DOCUMENTS

| 5,091,792 A * | 2/1992 | Kaida | G02F 1/133512 349/111 |
| 6,355,125 B1 * | 3/2002 | Tahon | B32B 17/10036 156/265 |
| 6,462,469 B1 * | 10/2002 | Young | H01L 51/5203 313/500 |
| 7,042,152 B2 * | 5/2006 | Tanaka | H01L 51/5221 313/504 |
| 2004/0241931 A1 * | 12/2004 | Akimoto | H01L 51/5215 438/220 |
| 2006/0255726 A1 * | 11/2006 | Kim | H01L 27/3276 313/506 |

(Continued)

FOREIGN PATENT DOCUMENTS

| KR | 1020110103735 A | 9/2011 |
| KR | 1020110122513 A | 11/2011 |

(Continued)

*Primary Examiner* — Caridad Everhart
(74) *Attorney, Agent, or Firm* — Cantor Colburn LLP

(57) ABSTRACT

A transparent organic light emitting display apparatus include a base substrate, a first electrode disposed on the base substrate, a second electrode disposed on the first electrode, the second electrode including a first portion disposed on the first electrode and a second portion which is disposed adjacent to the first portion, an oxygen content of the second portion being different from that of the first portion, and a light emitting structure disposed between the first portion of the second electrode and the first electrode.

20 Claims, 10 Drawing Sheets

(56) References Cited

U.S. PATENT DOCUMENTS

| | | | |
|---|---|---|---|
| 2007/0032000 A1* | 2/2007 | Yeh | G02F 1/133555 |
| | | | 438/149 |
| 2010/0237331 A1* | 9/2010 | Prakash | H01L 51/0021 |
| | | | 257/40 |
| 2012/0025224 A1* | 2/2012 | Yuasa | H01L 27/3246 |
| | | | 257/89 |
| 2013/0194528 A1* | 8/2013 | Wang | G02F 1/13306 |
| | | | 349/43 |
| 2013/0299805 A1* | 11/2013 | O'Neill | C09K 11/06 |
| | | | 257/40 |
| 2016/0240557 A1* | 8/2016 | Xu | G02F 1/134363 |

FOREIGN PATENT DOCUMENTS

| | | |
|---|---|---|
| KR | 1020130073721 A | 7/2013 |
| KR | 1020130138883 A | 12/2013 |
| KR | 1020140062258 A | 5/2014 |
| KR | 1020140087914 A | 7/2014 |

* cited by examiner

TRANSPARENT ORGANIC LIGHT EMITTING DISPLAY APPARATUS AND METHOD OF MANUFACTURING THE SAME

This application claims priority to Korean Patent Application No. 10-2015-0028881, filed on Mar. 2, 2015, and all the benefits accruing therefrom under 35 U.S.C. §119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a transparent organic light emitting display apparatus and a method of manufacturing the display apparatus.

2. Description of the Related Art

A display device displays an image using a pixel emitting light. An organic light emitting display device includes the pixel having an organic light emitting diode ("OLED"). The OLED emits the light of which a wavelength thereof depends on an organic material included in the OLED. For example, the OLED may include the organic material such that the OLED emits one of a red color light, a green color light and a blue color light. The organic light emitting display device displays the image by mixing lights emitted by organic materials of a plurality of OLEDs.

A transparent organic light emitting display apparatus has been developed by which an image is displayed and external light passes therethrough. The transparent display apparatus may transmit external light incident to a front thereof, so that an object disposed behind the transparent organic light emitting display apparatus is viewable to a user.

SUMMARY

One or more exemplary embodiment provides a transparent organic light emitting display apparatus capable of improving external light transmittance therethrough.

One or more exemplary embodiment also provides a method of manufacturing the transparent organic light emitting display apparatus.

According to an exemplary embodiment, a transparent organic light emitting display apparatus include a base substrate, a first electrode disposed on the base substrate, a second electrode disposed on the first electrode, the second electrode including a first portion disposed on the first electrode and a second portion which is disposed adjacent to the first portion, an oxygen content of the second portion being different from that of the first portion, and a light emitting structure disposed between the first electrode and the first portion of the second electrode.

In an exemplary embodiment, the first portion of the second electrode may overlap the first electrode. The second portion of the second electrode may not overlap the first electrode.

In an exemplary embodiment, the second portion of the second electrode may include more than about 0.1 weight percent (wt %) of oxygen. The first portion of the second electrode may include less than about 0.1 wt % of oxygen.

In an exemplary embodiment, the second electrode may include magnesium and/or silver. The second portion of the second electrode may include magnesium oxide and/or silver oxide.

In an exemplary embodiment, a thickness of the second portion of the second electrode may be substantially same as thickness of the first portion of the second electrode adjacent to the second portion of the second electrode.

In an exemplary embodiment, the thickness of the second electrode may be about 10 nanometers (nm) to about 13 nm.

In an exemplary embodiment, the transparent organic light emitting display apparatus may further include a pixel defining layer disposed overlapping the first electrode. The pixel defining layer may define an opening in which the light emitting structure is disposed.

In an exemplary embodiment, the opening defined by the pixel defining layer defines a window through which external light passes. The window defined by the opening defined by the pixel defining layer may overlap the second portion of the second electrode.

In an exemplary embodiment, the transparent organic light emitting display apparatus may further include a thin film transistor electrically connected to the first electrode. The pixel defining layer defining the opening may overlap the thin film transistor.

In an exemplary embodiment, the second electrode may be disposed corresponding to an entire surface of the base substrate.

In an exemplary embodiment, the transparent organic light emitting display apparatus may further include a sealing substrate disposed on the second electrode, the sealing substrate configured to block ambient air and moisture from the second electrode.

In an exemplary embodiment, the second portion of the second electrode may include a first layer, and a second layer disposed on the first layer. The second layer disposed on the first layer may include more than about 0.1 wt % of oxygen. The first portion of the second electrode and the first layer of the second portion of the second electrode may include less than about 0.1 wt % of oxygen.

In an exemplary embodiment, the first portion of the second electrode and the first layer of the second portion of the second electrode may include magnesium and/or silver. The second layer of the second portion of the second electrode may include magnesium oxide and/or silver oxide.

In an exemplary embodiment, a total thickness of the first portion of the second electrode may be about 10 nm to about 13 nm. A sum of thicknesses of the first and second layers of the second electrode may be about 10 nm to about 13 nm.

In an exemplary embodiment, the transparent organic light emitting display apparatus may include a plurality of pixels by which an image is displayed. Each pixel among the plurality of the pixels may include a transmitting area through which external light passes and a light emitting area in which light is emitted to display the image. The second portion of the second electrode may correspond to the transmitting area. The first portion of the second electrode may correspond to the light emitting area.

According to an exemplary embodiments a method of manufacturing a transparent organic light emitting display apparatus may include, forming a first electrode on a base substrate, forming a second electrode on the first electrode, forming a light emitting structure between the first electrode and the second electrode, and oxidizing a portion of the second electrode.

In an exemplary embodiment, the second electrode may include magnesium and/or silver. A thickness of the second electrode may be about 10 nm to about 13 nm.

In an exemplary embodiment, the oxidizing the portion of the second electrode may include providing a mask on the second electrode on the base substrate, the mask exposing a portion of the second electrode, and oxidizing the exposed portion of the second electrode with the mask on the second electrode on the base substrate.

In an exemplary embodiment, in providing the mask, the mask may be disposed on an upper surface of the base substrate.

In an exemplary embodiment, the second electrode may include a first portion and a second portion adjacent to the first portion. The first portion may not be oxidized in the oxidizing the portion of the second electrode, and the second portion may be oxidized in the oxidizing the portion of the second electrode. The second portion of the second electrode may include more than about 0.1 wt % of oxygen. The first portion of the second electrode may include less than about 0.1 wt % of oxygen.

Therefore, one or more exemplary embodiment of a transparent organic light emitting display apparatus according to the invention may include a second electrode disposed in a display area and a transparent (e.g., transmitting) area. The second electrode in the transmitting area may include a relatively higher oxygen content than that in the display area, so that transmittance of external light at the transmitting area may be improved.

In addition, in one or more exemplary embodiment of a method of manufacturing a transparent organic light emitting display apparatus, display area and transmitting area portions of a single, unitary second electrode material layer are simultaneously subjected to an oxidation process to improve the transmittance of external light through the transmitting area, so that a process of manufacturing the transparent organic light emitting display apparatus may be simplified and production yield may be improved.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
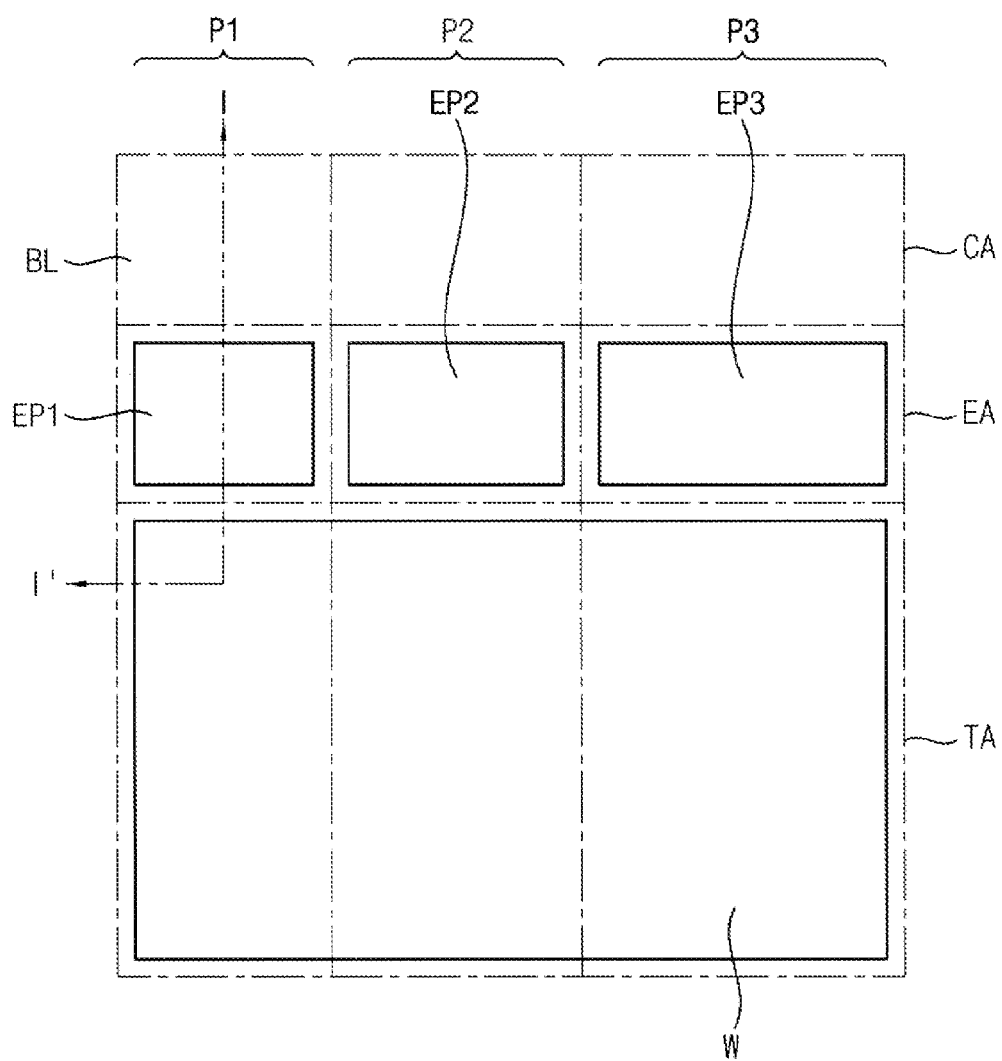
FIG. 1 is a plan view illustrating an exemplary embodiment of a pixel of a transparent organic light emitting display apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Transparency of the transparent organic light emitting display apparatus may be determined by transmittance of the external light therethrough. However, elements for displaying the image which are included within the transparent organic light emitting display apparatus may cause a decrease in the transmittance of the external light therethrough. Therefore, an improved transparent organic light emitting display apparatus for which a transmittance of external light therethrough is increased, is desired.

Hereinafter, the invention will be explained in detail with reference to the accompanying drawings.

FIG. 1 is a plan view illustrating an exemplary embodiment of a pixel of a transparent organic light emitting display apparatus according to the invention.

Referring to FIG. 1, a transparent organic light emitting display apparatus includes a plurality of pixels defined therein. A pixel among the plurality of pixels may include a plurality of sub-pixels. According to the exemplary embodiment, a collective pixel of the transparent organic light emitting display apparatus may include a first sub-pixel P1, a second sub-pixel P2 and a third sub-pixel P3.

The pixel of the transparent organic light emitting display apparatus may include a light blocking portion BL, a light emitting portion and a window W. The collective light emitting portion of the pixel may include a first light emitting portion EP1, a second light emitting portion EP2 and a third light emitting portion EP3 respectively corresponding to the first to third sub-pixels P1, P2 and P3.

The first light emitting portion EP1, the second light emitting portion EP2 and the third light emitting portion EP3 may emit lights having different colors from each other according to driving of the pixels of the transparent organic light emitting display apparatus. In an exemplary embodiment, for example, the first light emitting portion EP1 may emit red light, the second light emitting portion EP2 may emit green light, and the third light emitting portion EP3 may emit blue light.

The first light emitting portion EP1, the second light emitting portion EP2 and the third light emitting portion EP3 may have planar areas different from each other. In an exemplary embodiment, for example, when the first light emitting portion EP1 emits red light, the second light emitting portion EP2 emits green light and the third light emitting portion EP3 emits blue light, a planar area of the first light emitting portion EP1 may be smaller than that of the second light emitting portion EP2, and a planar area of the third light emitting portion EP3 may larger than that of the second light emitting portion EP2.

Each of the first to third sub-pixels may P1, P2 and P3 be divided into a circuit area CA, a light emitting area EA and a transmitting area TA.

Circuits for driving the pixels of the transparent organic light emitting display apparatus may be disposed in the circuit area CA. The circuit area CA may be covered by the light blocking portion BL, so that external light may not pass through the circuit area CA of the pixels. The circuit area CA of the pixel may also be referred to as a non-display region of the pixel.

The first to third light emitting portions EP1, EP2 and EP3 may be disposed in the collective light emitting area EA. The first to third light emitting portions EP1, EP2 and EP3 of the light emitting area EA may emit light according to driving of the pixels, so that the transparent organic light emitting display apparatus may display an image. The light emitting area EA of the pixel may also be referred to a display region of the pixel.

The window W which passes the external light may be disposed in the transmitting area TA. External light incident to the transparent organic light emitting display apparatus may pass through the window W, so that an object behind the transparent organic light emitting display apparatus is viewable by a user through the window W. The transmitting area TA of the pixel may also be referred to as a light transmitting region or an image transmitting region of the pixel.

In addition, a second electrode (refer to 172 and 174 of FIG. 2) is disposed corresponding an entire planar area of the pixel. The second electrode may be a cathode electrode of a light emitting structure (refer to 160 of FIG. 2) of the transparent organic light emitting display apparatus for emitting light used to display an image.

The second electrode may be disposed in entirety of each of the circuit area CA, the light emitting area EA and the transmitting area TA of the pixel. Oxygen content of a second electrode material of a portion of the second electrode which corresponds to the first to third light emitting portion EP1, EP2 and EP3, may be less than about 0.1 weight percent (wt %) based on a total weight of the portion of the second electrode in the first to third light emitting portion EP1, EP2 and EP3 of the pixel. In an exemplary embodiment, the oxygen content of the second electrode material of the portion of the second electrode which corresponds to the first to third light emitting portion EP1, EP2 and EP, may be zero.

Oxygen content of the second electrode material of a portion of the second electrode which corresponds to the transmitting area TA, may be more than about 0.1 wt % based on a total weight of the portion of the second electrode in the transmitting area TA of the pixel. In an exemplary embodiment, the oxygen content of the second electrode material of the portion of the second electrode which corresponds to the transmitting area TA, may be about 0.1 wt % to about 10 wt %.

Therefore, the oxygen content of the second electrode in the transmitting area TA at which the external light passes may be more than about 0.1 wt %, and the oxygen content of the second electrode in the light emitting area EA at which the external light is blocked may be less than about 0.1 wt %.

Accordingly, the oxygen content of the second electrode may be relatively high in the transmitting area TA, so that transmittance of the second electrode in the transmitting area TA may be relatively high. Thus, by varying the oxygen content of the electrode in the light emitting EA and transmitting TA regions, light emitting quality in the light emitting area EA may be maintained and external light transmittance in the transmitting area TA may be improved, so that transmission of external light through the transmitting area TA may be improved to improve an overall display quality of the transparent organic light emitting display apparatus.

Figure 2:
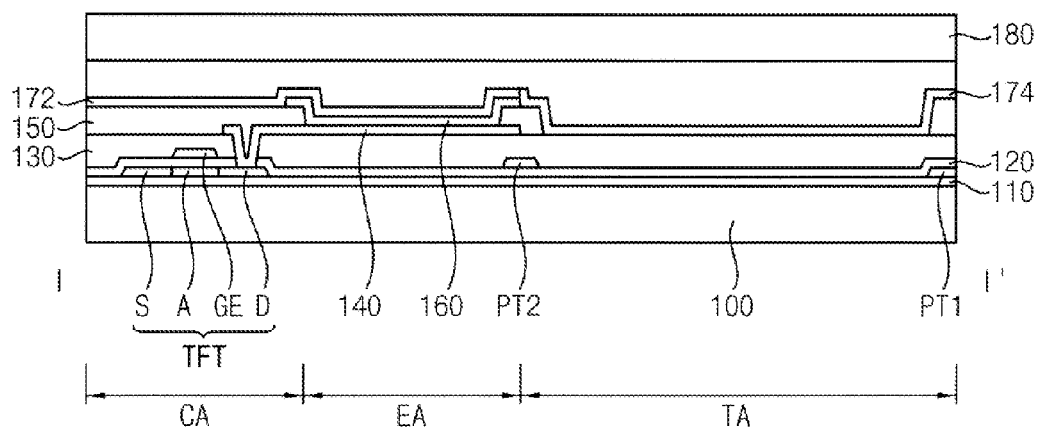
FIG. 2 is a cross-sectional view taken along line I-I' of FIG. 1.

FIG. 2 is a cross-sectional view taken along line I-I' of FIG. 1.

Referring to FIG. 2, the transparent organic light emitting display apparatus may include a base substrate 100, a buffer layer 110, a thin film transistor TFT, a first pattern PT1, a first insulation layer 120, a second pattern PT2, a second insulation layer 130, a first electrode 140, a pixel defining layer 150, a light emitting structure 160, a second electrode 172 and 174, and a sealing substrate 180.

The base substrate 100 may include a transparent insulation substrate. In an exemplary embodiment, for example, the base substrate 100 may include a glass substrate, a quartz substrate, a transparent resin substrate, etc. The transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may reduce or effectively prevent diffusion of metal atoms and/or impurities from the base substrate 100 to other layers of the transparent organic light emitting display apparatus on the base substrate 100. Additionally, in an exemplary embodiment of manufacturing the transparent organic light emitting display apparatus, the buffer layer 110 may adjust a heat transfer rate of a successive crystallization process in a process of forming the first pattern PT1, to thereby obtain a substantially uniform first pattern PT1.

Where the base substrate 100 may have a relatively irregular surface, the buffer layer 110 may improve flatness of the irregular surface of the base substrate 100. The buffer layer 110 may include or be formed using a silicon compound. In an exemplary embodiment, for example, the buffer layer 110 may include silicon oxide (SiOx), silicon nitride (SiNx), silicon oxynitride (SiOxNy), silicon oxycarbide (SiOxCy), silicon carbon nitride (SiCxNy), etc. These materials may be used alone or in a combination thereof. The buffer layer 110 may have a single layer structure or a multi layer structure. In an exemplary embodiment, for example, the buffer layer 110 may have a single-layered structure including a silicon oxide film, a silicon nitride film, a silicon oxynitride film, a silicon oxycarbide film or a silicon carbon nitride film. Alternatively, the buffer layer 110 may have a multilayered structure including at least two of a silicon oxide film, a silicon nitride film, a silicon oxynitride film, a silicon oxycarbide film, a silicon carbon nitride film, etc.

The first pattern PT1 may be disposed on the buffer layer 110. The first pattern PT1 may include silicon (Si). In an exemplary embodiment, the first pattern PT1 may include a semiconductor oxide containing a binary compound (ABx), a ternary compound (ABxCy) and/or a quaternary compound (ABxCyDz). In an exemplary embodiment, for example, the first pattern PT1 may include indium (In), zinc (Zn), gallium (Ga), stannum (Sn), titanium (Ti), aluminum (Al), hafnium (Hf), zirconium (Zr) and/or magnesium (Mg).

The first pattern PT1 may include an active area A, a source area S and a drain area D to respectively define an active area A, a source area S and a drain area D of the thin film transistor TFT. In addition, the first pattern PT1 may include a signal line configured to transmit signals which drive the pixels. In an exemplary embodiment, for example, the first pattern PT1 may include a data line elongated to extend in a second direction which is substantially perpendicular to a first direction and the data line may transmit a data voltage for driving the pixel.

The first insulation layer 120 may be disposed on the buffer layer 110. The first insulation layer 120 on the buffer layer 110 covers the first pattern PT1. The first insulation layer 120 may include a silicon compound, metal oxide, etc. In an exemplary embodiment, for example, the first insulation layer 120 may include or be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These materials may be used alone or in a combination thereof. In addition, the first insulation layer 120 may have a single layer structure or a multi layer structure including the silicon oxide and/or the silicon nitride. In exemplary embodiments, the first insulation layer 120 may be disposed at a uniform thickness (e.g., uniformly formed) on the buffer layer 110 along a profile of the first pattern PT1. The thickness of the first insulation layer 120 is taken a direction normal to the underlying surface or profile upon which it is disposed. Here, the first insulation layer 120 may have a substantially small thickness, such that a relatively small stepped portion is formed at a portion of the first insulation layer 120 adjacent to the first pattern PT1. In other exemplary embodiments, the first insulation layer 120 may disposed at a relatively large thickness as compared to the thickness of the first pattern PT1 for sufficiently covering the first pattern PT1, so that the first insulation layer 120 may have a substantially level surface even with the first pattern PT1 disposed thereunder.

The second pattern PT2 may be disposed on the first insulation layer 120. The second pattern PT2 may include metal, alloy, conductive metal oxide, a transparent conductive material, etc. In an exemplary embodiment, for example, the second pattern PT2 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These materials may be used alone or in a combination thereof. In exemplary embodiments, the second pattern PT2 may have a single layer structure or a multi layer structure. The second pattern PT2 may include a metal film, an alloy film, a metal nitride film, a conductive metal oxide film and/or a transparent conductive film.

The second pattern PT2 may include a gate electrode GE of the thin film transistor TFT. The gate electrode GE may overlap the active area A of the first pattern PT1 defining the active area A of the TFT. Thus, the active area A, the source area S, the drain area D and the gate electrode GE along with one or more insulating layers disposed therebetween may collectively define the thin film transistor TFT.

In addition, the second pattern PT2 may include a signal line configured to transmit signals which drive the pixel. In an exemplary embodiment, for example, the second pattern PT2 may include a gate line elongated to extend in the first direction and the gate line may transmit a gate or scan signal for driving the pixel.

The second insulation layer 130 may disposed on the first insulation layer 120 including the second pattern PT2 thereon. The second insulation layer 130 may have a single-layered structure or a multi-layered structure including at least two insulation films. The second insulation layer 130 may include or be formed using an organic material. In an exemplary embodiment, for example, the second insulation layer 130 may include or be formed using a photoresist, acryl-based resin, polyimide-based resin, polyamide-based resin, siloxane-based resin, etc. These materials may be used alone or in a combination thereof. Alternatively, the second insulation layer 130 may include or be formed using an inorganic material. In an exemplary embodiment, for example, the second insulation layer 130 may include or be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These materials may be used alone or in a combination thereof.

The first electrode 140 may be disposed on the second insulation layer 130. The first electrode 140 may be electrically connected to the thin film transistor TFT such as through a contact hole which is defined in or formed through the second insulation layer 130 and the first insulation layer 120.

The first electrode 140 may include a reflective material or a transmissive material in accordance with the emission type of the transparent organic light emitting display apparatus. In an exemplary embodiment, for example, the first electrode 140 may include or be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in a combination thereof. In exemplary embodiments, the first electrode 140 may have a single layer structure or a multi layer structure. The first electrode 140 may include a metal film, an alloy film, a metal nitride film, a conductive metal oxide film and/or a transparent conductive film.

The pixel defining layer 150 may be disposed on the second insulation layer 130 including the first electrode 140 thereon. The pixel defining layer 150 may include an organic material or an inorganic material. In an exemplary embodiment, for example, the pixel defining layer 150 may include or be formed using photoresist, acryl-based resin, polyacryl-based resin, polyimide-based resin, a silicon compound, etc.

The pixel defining layer 150 may define openings corresponding to a window (refer to W of FIG. 1) in the transmitting area TA at which external light passes and corresponding to light emitting portions (refer to EP1, EP2 and EP3 of FIG. 1) at which light is emitted, respectively. Thus, the pixel defining layer 150 may block light corresponding to the light blocking portion BL of FIG. 1. The first electrode 140 is exposed by the openings defined by portions of the pixel defining layer 150 in the light emitting portions.

The light emitting structure 160 may be positioned on the first electrode 140 exposed by the opening defined by portions of the pixel defining layer 150. The light emitting structure 160 may extend from the exposed first electrode 140 at a bottom of the opening to be disposed on a sidewall of the pixel defining layer 150 at the opening. In an exemplary embodiment of manufacturing the transparent organic light emitting display apparatus, the light emitting structure 160 may be formed by a laser induced thermal imaging process, a printing process, etc.

The light emitting structure 160 may include an organic light emitting layer (EL), a hole injection layer (HIL), a hole transfer layer (HTL), an electron transfer layer (ETL), an electron injection layer (EIL), etc. In exemplary embodiments, a plurality of organic light emitting layers may be respectively formed using a light emitting material for generating a color of light such as a red color of light (R), a green color of light (G) and a blue color of light (B) in accordance with color pixels of the display device. In some exemplary embodiments, the organic light emitting layer of the of an individual light emitting structure 160 may include therein a plurality of stacked light emitting materials for respectively generating a red color of light, a green color of light and a blue color of light and such colors of light may be combined such that the individual light emitting structure 160 emits a white color of light.

The second electrode 172 and 174 may be disposed on the pixel defining layer 150, the light emitting structure 160 and the second insulation layer 130. The second electrode 172 and 174 may include a first portion 172 and a second portion 174. The second electrode 172 and 174 may include a metal. In an exemplary embodiment, for example, the second electrode 172 and 174 may include a material such as magnesium and/or silver. A thickness of the second electrode 172 and 174 may be about 10 nanometers (nm) to about 13 nm. The thickness is taken a direction normal to the underlying surface or profile upon which it is disposed.

The first portion 172 of the second electrode may be elongated to be disposed on the light emitting structure 160 and on the pixel defining layer 150. The first portion 172 may include a metal. In an exemplary embodiment, for example, the first portion 172 may include a material such as magnesium and/or silver, and a thickness of the second portion 172 about 10 nm to 13 about nm.

An oxygen content of the material forming the first portion 172 of the second electrode may be less than about 0.1 wt %. In an exemplary embodiment, the oxygen content of the first portion 172 of the second electrode may be zero.

The second portion 174 of the second electrode may be elongated to be disposed on the second insulation layer 130 and on the pixel defining layer 150. The second portion 174 may include a metal oxide. In an exemplary embodiment, for example, the second portion 174 may include a material such as magnesium oxide and/or silver oxide, and a thickness of the second portion 174 may be about 10 nm to 13 nm.

An oxygen content of the second portion 174 of the second electrode may be more than about 0.1 wt %. In an exemplary embodiment, the oxygen content of the second portion 174 of the second electrode may be about 0.1 wt % to about 10 wt %.

The thicknesses of the first portion 172 and second portion 174 of the second electrode may be substantially the same each other.

The sealing substrate 180 may be disposed on the second electrode 172 and 174. The sealing substrate 180 may include a transparent material and be configured to reduce or effectively prevent ambient air and moisture from permeating into the transparent organic light emitting display apparatus. The sealing substrate 180 may be combined with the base substrate 100 to seal a space between the base substrate 100 or layers of the transparent organic light emitting display apparatus disposed on the base substrate 100, and the sealing substrate 180, such as by a sealing agent (not shown).

A desiccant or a filler may be filled into the above-defined space sealed by the sealing agent. A thin sealing film instead of the sealing substrate 180 may be disposed or formed on the second electrode 172 and 174 to protect the second electrode 172 and 174 and the light emitting structure 160 form ambient air and moisture. The sealing film may have a structure in which a layer including or formed of an inorganic material such as silicon oxide or silicon nitride and a layer such as epoxy or polyimide are alternately stacked. However the invention is not limited thereto and the structure of the sealing film may be any of a number of sealing structures having a form of a transparent thin film.

Referring again to FIGS. 1 and 2, the transparent organic light emitting display apparatus may include a plurality of pixels defined therein. A pixel among the plurality of pixels may include a first sub-pixel P1, a second sub-pixel P2 and a third sub-pixel P3.

The first sub-pixel P1 may include a light blocking portion BL, a first light emitting portion EP1 and a window W in a transmitting area TA.

The light blocking portion BL may block external light. The pixel defining layer 150 in the first sub-pixel P1 may function as the light blocking portion BL thereof.

The first light emitting portion EP1 may emit light to display an image. The light emitting structure 160 between portions of the pixel defining layers 150 in the light emitting area EA of the first sub-pixel P1 may function as the first light emitting portion EP1 thereof.

The second sub-pixel P2 may include a light blocking portion BL, a second light emitting portion EP2 and a window W in a transmitting area TA.

The light blocking portion BL may block external light. The pixel defining layer 150 in the second sub-pixel P2 may function as the light blocking portion BL thereof.

The second light emitting portion EP2 may emit light to display the image. The light emitting structure 160 between portions of the pixel defining layers 150 in the light emitting area EA of the second sub-pixel P2 may function as the second light emitting portion EP2 thereof.

The third sub-pixel P3 may include a light blocking portion BL, a third light emitting portion EP3 and a window W in a transmitting area TA.

The light blocking portion BL may block external light. The pixel defining layer 150 in the third sub-pixel P3 may a function of the light blocking portion BL thereof.

The third light emitting portion EP3 may emit light to display the image. The light emitting structure 160 between portions of the pixel defining layers 150 in the light emitting area EA of the third sub-pixel P3 may function of the third light emitting portion EP3 thereof.

Figure 3:
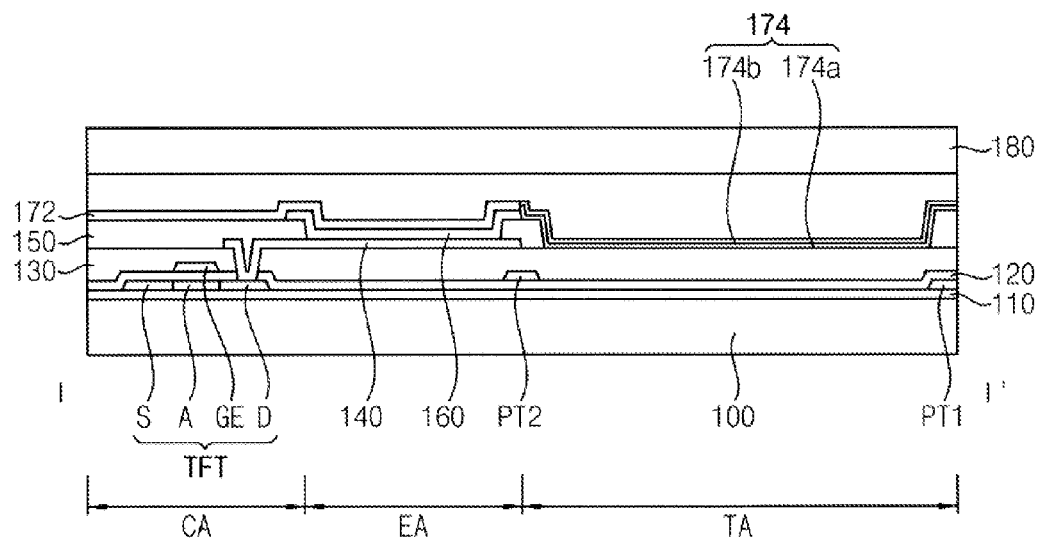
FIG. 3 is a cross-sectional view illustrating another exemplary embodiment of a transparent organic light emitting display apparatus according to the invention.

FIG. 3 is a cross-sectional view illustrating another exemplary embodiment of a transparent organic light emitting display apparatus according to the invention.

Referring to FIG. 3, a transparent organic light emitting display apparatus may be substantially the same as the transparent organic light emitting display apparatus of FIG. 1, except for a second electrode 172 and 174. Thus, any further detailed descriptions concerning the same elements will be briefly explained or be omitted.

The transparent organic light emitting display apparatus may include a plurality of pixels defined therein.

An individual pixel among the plurality of pixels may include a light blocking portion, a light emitting portion and a window W. The light emitting portion may emit light according to driving of the pixels.

Each of the sub-pixels, and consequently each of the pixels, may be divided into a circuit area CA, a light emitting area EA and a transmitting area TA.

Circuits for driving the pixels of the transparent organic light emitting display apparatus may be disposed in the circuit area CA. The light emitting portion may be disposed in the light emitting area EA. The window W may be disposed in the transmitting area TA.

The transparent organic light emitting display apparatus may include a base substrate 100, a buffer layer 110, a thin film transistor TFT, a first pattern PT1, a first insulation layer 120, a second pattern PT2, a second insulation layer 130, a first electrode 140, a pixel defining layer 150, a light emitting structure 160, a second electrode 172 and 174, and a sealing substrate 180.

The base substrate 100 may include a transparent insulation substrate.

The buffer layer 110 may be disposed on the base substrate 100. The buffer layer 110 may reduce or effectively prevent diffusion of metal atoms and/or impurities from the base substrate 100 to other layers of the transparent organic light emitting display apparatus on the base substrate 100. Additionally, in an exemplary embodiment of manufacturing the transparent organic light emitting display apparatus, the buffer layer 110 may adjust a heat transfer rate of a successive crystallization process in a process for forming the first pattern PT1, to thereby obtain a substantially uniform first pattern PT1.

The first pattern PT1 may be disposed on the buffer layer 110. The first pattern PT1 may include silicon (Si). In another exemplary embodiment, the first pattern PT1 may include a semiconductor oxide, etc.

The first pattern PT1 may include an active area A, a source area S and a drain area D to respectively define an active area A, a source area S and a drain area D of the thin film transistor TFT. In addition, the first pattern PT1 may include a signal line configured to transmit a signal for driving the pixels.

The first insulation layer 120 may be disposed on the buffer layer 110. The first insulation layer 120 on the buffer layer 110 covers the first pattern PT1. The first insulation layer 120 may include a silicon compound, metal oxide, etc.

The second pattern PT2 may be disposed on the first insulation layer 120. The second pattern PT2 may include metal, alloy, conductive metal oxide, a transparent conductive material, etc.

The second pattern PT2 may include a gate electrode GE of the thin film transistor TFT. The gate electrode GE may overlap the active area A of the first pattern PT1 defining the active area A, the source area S and the drain area D of the TFT. Thus, the active area A, the source area S, the drain area D and the gate electrode GE may collectively define the thin film transistor TFT with one or more insulating layers disposed therebetween.

In addition, the second pattern PT2 may include a signal line configured to transmit a signal for driving the pixel.

The second insulation layer 130 may disposed on the first insulation layer 120 including the second pattern PT2 thereon. The second insulation layer 130 may be formed using an organic material or an inorganic material.

The first electrode 140 may be disposed on the second insulation layer 130. The first electrode 140 may be electrically connected to the thin film transistor TFT through a contact hole which is defined or formed through the second insulation layer 130 and the first insulation layer 120.

The first electrode 140 may include a reflective material or a transmissive material in accordance with the emission type of the transparent organic light emitting display apparatus.

The pixel defining layer 150 may be disposed on the second insulation layer 130 including the first electrode 140 thereon. The pixel defining layer 150 may include an organic material or an inorganic material.

The pixel defining layer 150 may define openings corresponding to a window (refer to W of FIG. 1) in the transmitting area TA at which external light passes and light emitting portions (refer to EP1, EP2 and EP3 of FIG. 1) at which light is emitted, respectively.

The light emitting structure 160 may be positioned on the first electrode 140 exposed by the opening defined by portions of the pixel defining layer 150.

The second electrode 172 and 174 may be disposed on the pixel defining layer 150, the light emitting structure 160 and the second insulation layer 130. The second electrode 172 and 174 may include a first portion 172 and a second portion 174. The second electrode 172 and 174 may include a metal. In an exemplary embodiment, for example, the second electrode may include magnesium and/or silver, and have thickness of about 10 nm to about 13 nm.

The first portion 172 of the second electrode may be elongated to be disposed on the light emitting structure 160 and on the pixel defining layer 150. The first portion 172 may include a metal. In an exemplary embodiment, for example, the first portion 172 may include magnesium and/or silver, and have thickness of about 10 nm to about 13 nm.

An oxygen content of the first portion 172 of the second electrode may be less than about 0.1 wt %. In an exemplary embodiment, the oxygen content of the first portion 172 of the second electrode may be zero.

The second portion 174 of the second electrode may be elongated to be disposed on the second insulation layer 130 and on the pixel defining layer 150. The second portion 174 may include a first layer 174a, and a second layer 174b disposed on the first layer 174a.

The first layer 174a may include a metal. In an exemplary embodiment, for example, the first layer 174a may include magnesium and/or silver. An oxygen content of the first layer 174a of the second portion 174 of the second electrode may be less than about 0.1 wt %. In an exemplary embodiment, the oxygen content of the first layer 174a of the second portion 174 of the second electrode may be zero.

The second layer 174b may include metal oxide. In an exemplary embodiment, for example, the second layer 174b may include magnesium oxide and/or silver oxide. An oxygen content of the second layer 174b of the second portion of the second electrode may be more than about 0.1 wt %. In an exemplary embodiment, the oxygen content of the second layer 174b of the second portion of the second electrode may be about 0.1 wt % to about 10 wt %.

Here, a sum of the thicknesses of the first layer 174a and the second layer 174b may be about 10 nm to about 13 nm.

A total or maximum thickness of the first portion 172 of the second electrode may be substantially same as the sum of the thicknesses of the first layer 174a and the second layer 174b.

The sealing substrate 180 may be disposed on the second electrode 172 and 174. The sealing substrate 180 may include a transparent material and be configured to reduce or effectively prevent ambient air and moisture from permeating into the transparent organic light emitting display apparatus. A desiccant or a filler may be filled into the space between the base substrate 100 or layers of the transparent organic light emitting display apparatus disposed on the base substrate 100, and the sealing substrate 180.

FIGS. 4A to 4I are cross-sectional views illustrating an exemplary embodiment of a method of manufacturing the transparent organic light emitting display apparatus of FIG. 1.

Figure 4A:
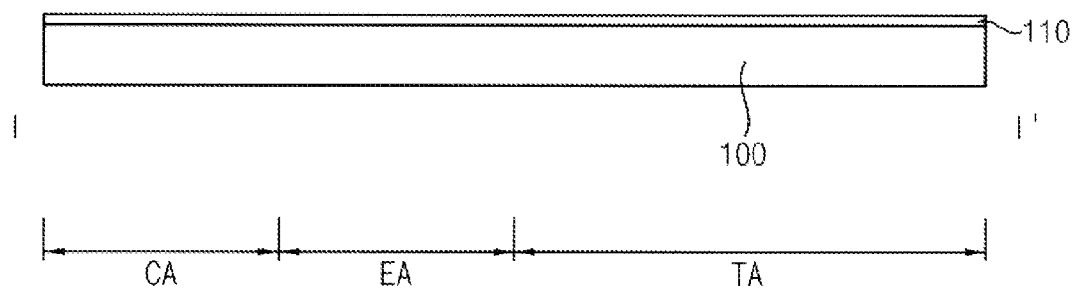
FIGS. 4A to 4L are cross-sectional views illustrating an exemplary embodiment of a method of manufacturing the transparent organic light emitting display apparatus of FIG. 1.

Referring to FIG. 4A, a buffer layer 110 may be formed on a base substrate 100.

The base substrate 100 may include a transparent insulation substrate. In an exemplary embodiment, for example, the base substrate 100 may include a glass substrate, a quartz substrate, a transparent resin substrate, etc. The transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may be obtained on the base substrate 100 by a spin coating process, a chemical vapor deposition ("CVD") process, a plasma enhanced chemical vapor deposition ("PECVD") process, a high density plasma-chemical vapor deposition ("HDP-CVD") process, a printing process, etc.

Figure 4B:
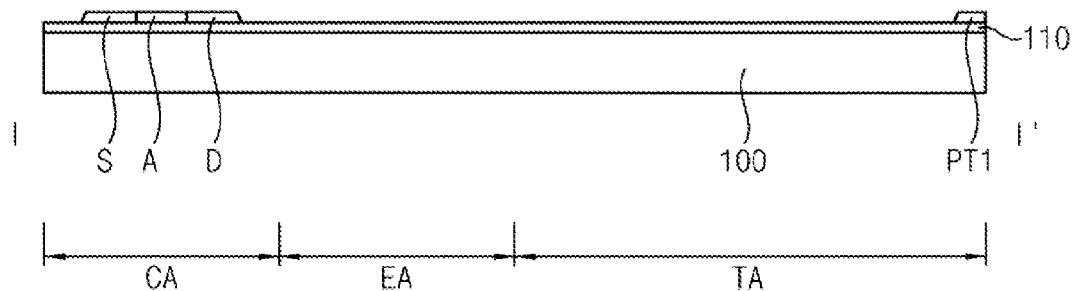

Referring to FIG. 4B, a first pattern PT1 may be formed on the buffer layer 110. The first pattern PT1 may include an active pattern including an active area A, a source area S and a drain area D corresponding to an active area A, a source area S and a drain area D of the thin film transistor (refer to the TFT of FIG. 4D). In addition, the first pattern PT1 may include a signal line configured to drive the pixels. In an exemplary embodiment, for example, the first pattern PT1 may include a data line elongated to extend in a second direction which is substantially perpendicular to a first direction and the data line may transmit a data voltage for driving the pixel.

In exemplary embodiments, a semiconductor material layer (not illustrated) may be formed on the buffer layer 110, and then a preliminary active layer (not illustrated) may be formed on the buffer layer 110 by patterning the semiconductor material layer. The crystallization process may be performed on the preliminary active layer to form the first pattern PT1 including the active pattern on the buffer layer 110. Here, the semiconductor material layer may be formed by a CVD process, a PECVD process, a low pressure chemical vapor deposition ("LPCVD") process, a sputtering process, a printing process, etc. When the semiconductor material layer includes amorphous silicon, the formed active pattern may include polysilicon. The crystallization process for forming the active pattern may include a laser irradiation process, a thermal treatment process, a thermal process utilizing a catalyst, etc. In some exemplary embodiments, a dehydrogenation process may be performed on the semiconductor material layer and/or the preliminary active layer after forming the semiconductor material layer and/or the preliminary active layer on the buffer layer 110. The dehydrogenation process may reduce the hydrogen concentration of the semiconductor material layer and/or the preliminary active layer, so that the finally formed active pattern of the thin film transistor TFT may have improved electrical characteristics.

A portion of the active pattern may be doped by an impurity such that the doped portion may have a higher electrical conductivity than a remaining region of the active pattern.

Figure 4C:
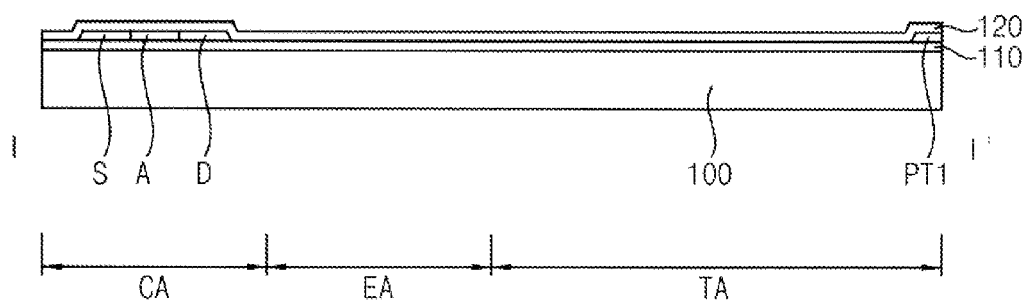

Referring to FIG. 4C, the first insulation layer 120 may be formed on the first pattern PT1.

The first insulation layer 120 may be formed by a CVD process, a spin coating process, a PECVD process, a sputtering process, a vacuum evaporation process, an HDP-CVD process, a printing process, etc.

Figure 4D:
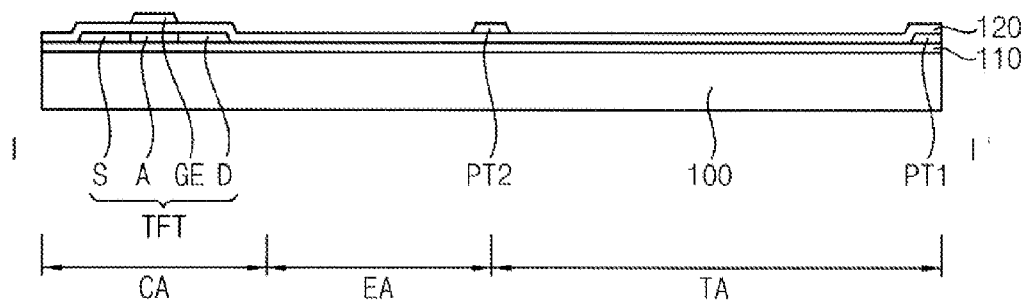

Referring to FIG. 4D, a second pattern PT2 may be formed on the first insulation layer 120.

In exemplary embodiments, a first conductive material layer (not illustrated) may be formed on the first insulation layer 120, and then the first conductive material layer may be partially etched by a photolithography process or an etching process using an additional etching mask. Hence, the second pattern PT2 may be provided on the first insulation layer 120. The first conductive material layer may be formed by a printing process, a sputtering process, a CVD process, a pulsed laser deposition ("PLD") process, a vacuum evaporation process, an atomic layer deposition ("ALD") process, etc.

The second pattern PT2 may include a gate electrode GE of the thin film transistor TFT. The gate electrode GE may overlap the active area A of the first pattern PT1 defining the active area A of the TFT. Thus, the active area A, the source area S, the drain area D and the gate electrode GE along with one or more insulating layers disposed therebetween may collectively define the thin film transistor TFT.

In addition, the second pattern PT2 may include a signal line configured to drive the pixel. In an exemplary embodiment, for example, the second pattern PT2 may include a gate line elongated to extend in the first direction and the gate line may transmit a gate or scan signal for driving the pixel.

Figure 4E:
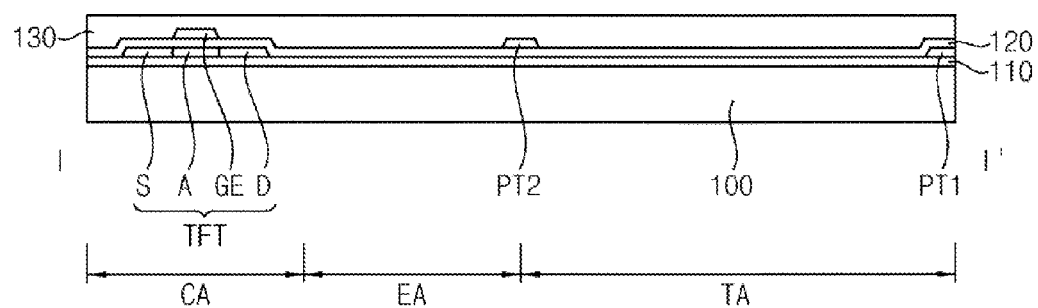

Referring to FIG. 4E, a second insulation layer 130 may be formed on the first insulation layer 120 including the second pattern PT2 thereon.

The second insulation layer 130 may be formed by a CVD process, a spin coating process, a PECVD process, a sputtering process, a vacuum evaporation process, an HDP-CVD process, a printing process, etc.

Figure 4F:
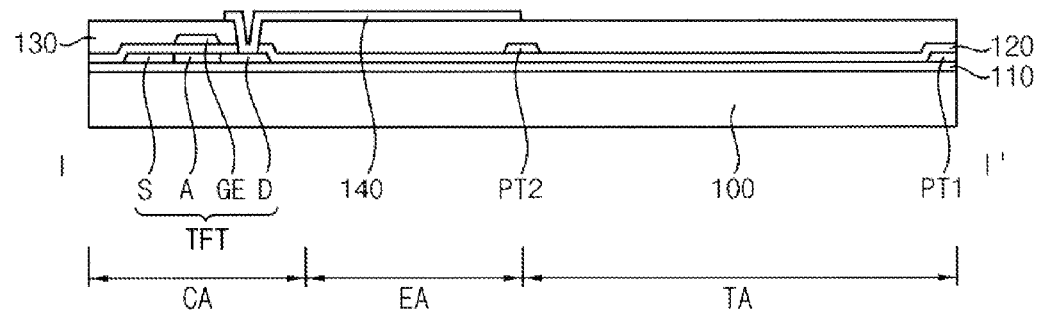

Referring to FIG. 4F, a first electrode 140 may be formed on the second insulation layer 130.

A contact hole which exposes the drain area D of the thin film transistor TFT may be formed by partially etching the first and second insulation layers 120 and 130. And then, a second conductive material layer may be formed on the second insulation layer 130 to fill the contact hole. After that, a first electrode 140 may be obtained by patterning the second conducive material layer. Here, the second conductive material layer may be formed by a printing process, a sputtering process, a CVD process, a pulsed laser deposition (PLD) process, a vacuum evaporation process, an atomic layer deposition ("ALD") process, etc.

Figure 4G:
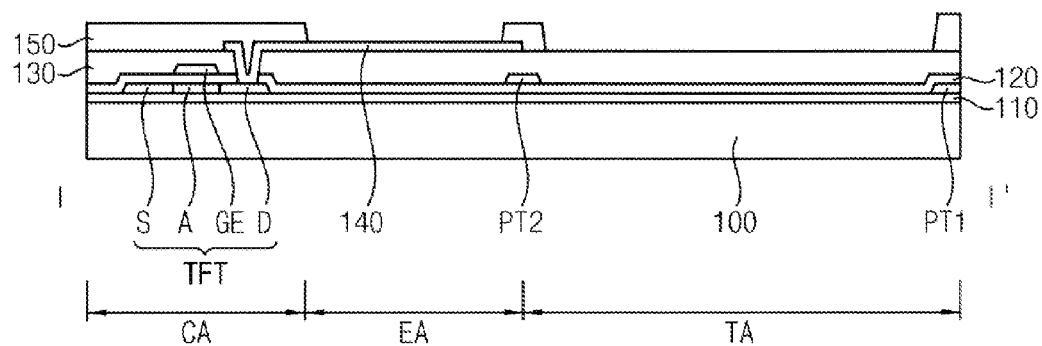

Referring to FIG. 4G, a pixel defining layer 150 may be formed on the second insulation layer 130 including the first electrode 140 thereon.

The pixel defining layer 150 may be obtained by depositing a pixel defining material layer such as by a spin coating process, a spray process, a printing process, a CVD process, a PECVD process, an HDP-CVD process, etc. In exemplary embodiments, the pixel defining material layer may be partially etched to form an opening partially exposing the first electrode 140 and an opening corresponding to a window (refer to W of FIG. 1). The openings defined by portions of the pixel defining layer 150 may define a display region, a non-display region and a transmitting region of the transparent organic light emitting display apparatus.

Figure 4H:
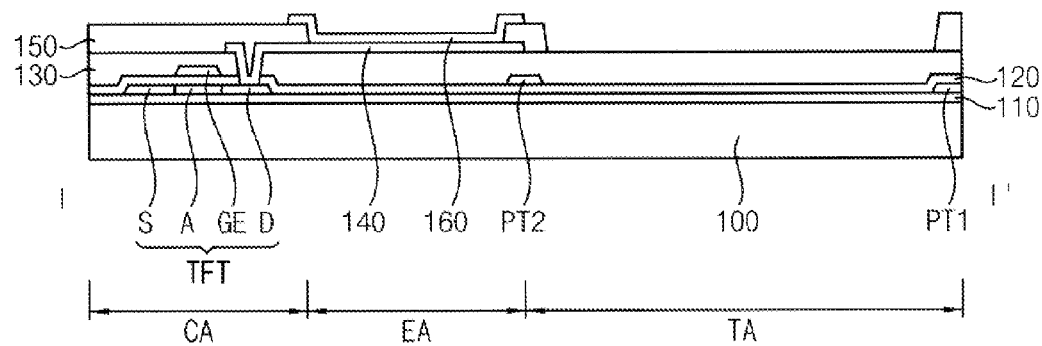

Referring to FIG. 4H, a light emitting structure 160 may be formed on the first electrode 140 including the pixel defining layer 150 thereon.

The light emitting structure 160 may be formed on the first electrode 140 exposed by the opening defined by portions of the pixel defining layer 150. The light emitting structure 160 may be formed by a laser induced thermal imaging process, a printing process, etc.

Figure 4I:
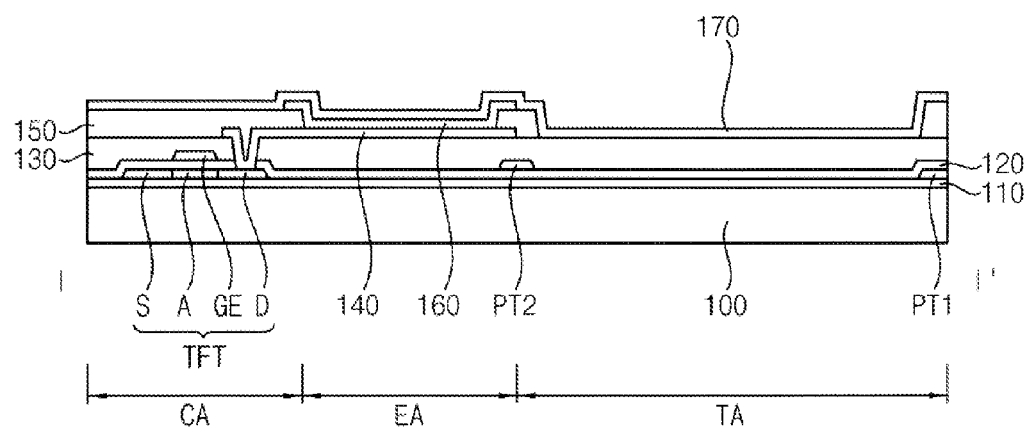

Referring to FIG. 4I, a preliminary second electrode 170 may be formed on the light emitting structure 160, the pixel defining layer 150 and the second insulation layer 130.

The preliminary second electrode 170 may be formed by a printing process, a sputtering process, a CVD process, an ALD process, a vacuum evaporation process, a PLD process, etc. related to a material for forming the second electrode of the transparent organic light emitting display apparatus.

In an exemplary embodiment, for example, the preliminary second electrode 170 may include material such as magnesium and/or silver, and a thickness of the preliminary second electrode 170 may be about 10 nm to about 13 nm.

Figure 4J:
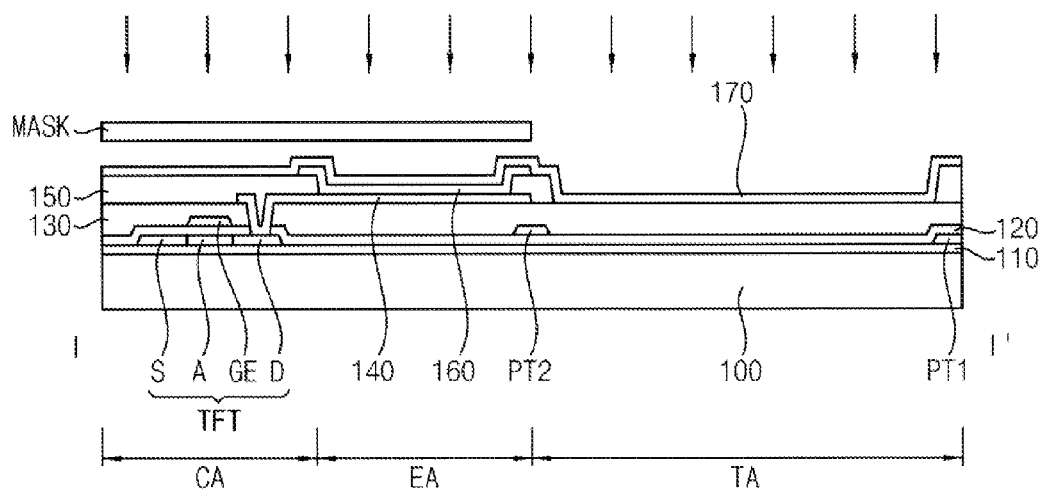
Figure 4K:
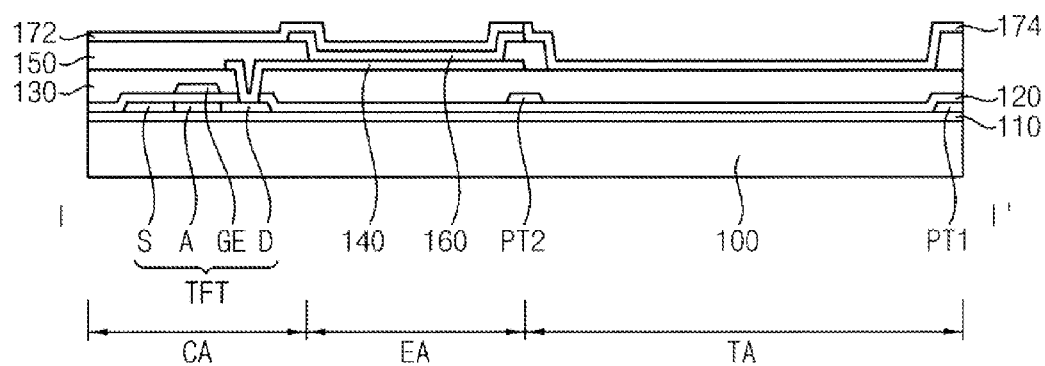

Referring to FIGS. 4J and 4K, a second electrode 172 and 174 may be formed by partially oxidizing the preliminary second electrode 170.

In exemplary embodiments, a mask MASK may be disposed on the preliminary second electrode 170 to cover a circuit area CA and a light emitting area EA. The mask MASK may be a fine metal mask ("FMM"). After that, a portion of the preliminary second electrode 170 which is not covered by the mask MASK and corresponds to a transmitting area TA may be oxidized such as by an oxygen plasma treatment (indicated by the downward arrows of FIG. 4J).

Here, the mask MASK may be disposed on the base substrate 100, and oxygen may be provided in a direction from top to bottom, so that the preliminary second electrode 170 may be oxidized. Thus, the above process may be performed with the base substrate 100 and layers formed thereon facing upward, such that the mask MASK is disposed above the collective display substrate including the base substrate 100 and the layers formed thereon. Thus, although a transparent organic light emitting display apparatus has an increased planar dimension, since the mask MASK is disposed above the display substrate and overlapping the circuit area CA and the light emitting area EA, failures due to deformation or sag of the mask MASK may be decreased.

Portions of the single, unitary second electrode material layer respectively overlapped with the mask MASK and not overlapped by the mask MASK are simultaneously subjected to the above-described oxidizing treatment. Even though the portions 172 and 174 of the second electrode are formed from a same second electrode material layer which is simultaneously subjected to the above-described oxidizing treatment, the oxygen content of the portions 172 and 174 of the second electrode have different oxygen contents from each other.

Referring again to FIG. 4K, the second electrode may include a first portion 172 which corresponds to the circuit area CA and the emitting area EA and a second portion 174 which corresponds to the transmitting area TA.

The first portion 172 of the second electrode may include a metal. In an exemplary embodiment, for example, the first portion 172 may include magnesium and/or silver, and a thickness of the first portion 172 may be about 10 nm to about 13 nm.

An oxygen content of the first portion 172 of the second electrode may be less than about 0.1 wt %. In an exemplary embodiment, the oxygen content of the first portion 172 of the second electrode may be zero.

The second portion 174 of the second electrode may include a metal oxide. In an exemplary embodiment, for example, the second portion 174 may include magnesium oxide and/or silver oxide, and a thickness of the second portion 174 may be about 10 nm to about 13 nm.

An oxygen content of the second portion 174 of the second electrode may be more than about 0.1 wt %. In an exemplary embodiment, the oxygen content of the second portion 174 of the second electrode may be about 0.1 wt % to about 10 wt %.

The thicknesses of the first portion 172 and second portion 174 of the second electrode may be substantially the same each other.

Figure 4L:
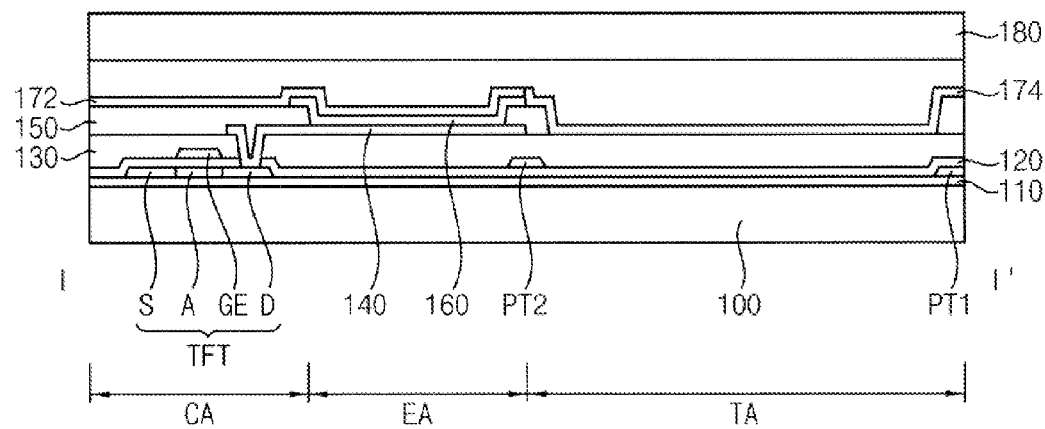

Referring to FIG. 4L, the second electrode 172 and 174 may be sealed from an environment outside transparent organic light emitting display apparatus such as by using the sealing substrate 180.

The sealing substrate 180 may include a transparent material, and may reduce or effectively prevent ambient air and moisture from permeating into the transparent organic light emitting display apparatus. The sealing substrate 180 may be combined with the base substrate 100 to seal a space between the base substrate 100 or layers of the transparent organic light emitting display apparatus disposed on the base substrate 100, and the sealing substrate 180, such as by a sealing agent (not shown).

FIGS. 5A to 5D are cross-sectional views illustrating an exemplary embodiment of a method of manufacturing the transparent organic light emitting display apparatus of FIG. 3.

Figure 5A:
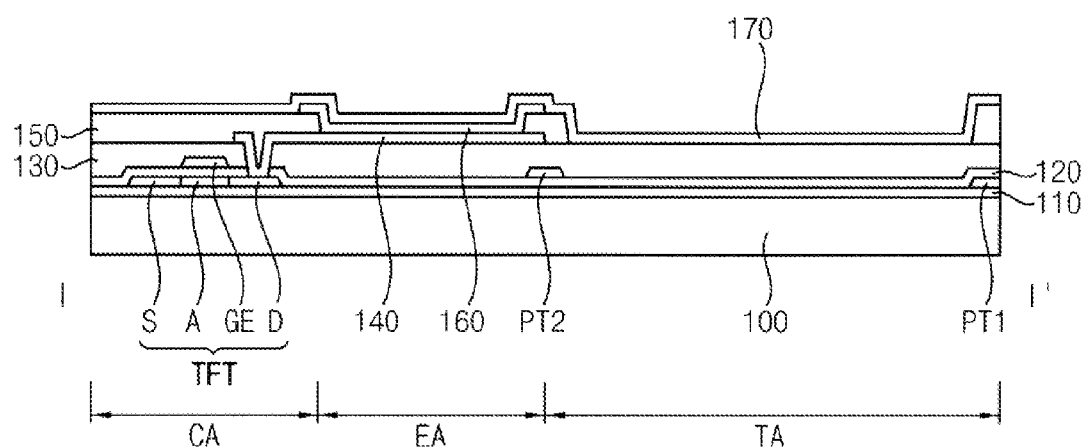
FIGS. 5A to 5D are cross-sectional views illustrating an exemplary embodiment of a method of manufacturing the transparent organic light emitting display apparatus of FIG. 3.

Referring to FIG. 5A, a buffer layer 110 may be formed on a base substrate 100.

The base substrate 100 may include a transparent insulation substrate. In an exemplary embodiment, for example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may be obtained on the base substrate 100 by a spin coating process, a chemical vapor deposition ("CVD") process, a plasma enhanced chemical vapor deposition ("PECVD") process, a high density plasma-chemical vapor deposition ("HDP-CVD") process, a printing process, etc.

A first pattern PT1 may be formed on the buffer layer 110. The first pattern PT1 may include an active pattern including an active area A, a source area S and a drain area D corresponding to an active area A, a source area S and a drain area D of the thin film transistor TFT. In addition, the first pattern PT1 may include a signal line configured to drive the pixels. In an exemplary embodiment, for example, the first pattern PT1 may include a data line elongated to extend in a second direction which is substantially perpendicular to a first direction and the data line may transmit a data voltage for driving the pixel.

In exemplary embodiments, a semiconductor material layer (not illustrated) may be formed on the buffer layer 110, and then a preliminary active layer (not illustrated) may be formed on the buffer layer 110 by patterning the semiconductor material layer. The crystallization process may be performed on the preliminary active layer to form the first pattern PT1 including the active pattern on the buffer layer 110. Here, the semiconductor material layer may be formed by a CVD process, a PECVD process, a low pressure chemical vapor deposition (LPCVD) process, a sputtering process, a printing process, etc. When the semiconductor material layer includes amorphous silicon, the formed active pattern may include polysilicon. The crystallization process for forming the active pattern may include a laser irradiation process, a thermal treatment process, a thermal process utilizing a catalyst, etc. In some exemplary embodiments, a dehydrogenation process may be performed on the semiconductor material layer and/or the preliminary active layer after forming the semiconductor material layer and/or the preliminary active layer on the buffer layer 110. The dehydrogenation process may reduce the hydrogen concentration of the semiconductor material layer and/or the preliminary active layer, so that the finally formed active pattern may have improved electrical characteristics.

A portion of the active pattern may be doped by an impurity such that the doped portion may have a higher electrical conductivity than a remaining region of the active pattern.

A first insulation layer 120 may be formed on the first pattern PT1.

The first insulation layer 120 may be formed by a CVD process, a spin coating process, a PECVD process, a sputtering process, a vacuum evaporation process, an HDP-CVD process, a printing process, etc.

A second pattern PT2 may be formed on the first insulation layer 120.

In exemplary embodiments, a first conductive material layer (not illustrated) may be formed on the first insulation layer 120, and then the first conductive material layer may be partially etched by a photolithography process or an etching process using an additional etching mask. Hence, the second pattern PT2 may be provided on the first insulation layer 120. The first conductive material layer may be formed by a printing process, a sputtering process, a CVD process, a pulsed laser deposition ("PLD") process, a vacuum evaporation process, an atomic layer deposition ("ALD") process, etc.

The second pattern PT2 may include a gate electrode GE of the thin film transistor TFT. The gate electrode GE may overlap the active area A of the first pattern PT1 defining the active area A of the TFT. Thus, the active area A, the source area S, the drain area D and the gate electrode GE along with one or more insulating layers disposed therebetween may collectively define the thin film transistor TFT.

In addition, the second pattern PT2 may include a signal line configured to drive the pixel. In an exemplary embodiment, for example, the second pattern PT2 may include a gate line elongated to extend the first direction and the gate line may transmit a gate or scan signal for driving the pixel.

A second insulation layer 130 may be formed on the first insulation layer 120 including the second pattern PT2 thereon.

The second insulation layer 130 may be formed by a CVD process, a spin coating process, a PECVD process, a sputtering process, a vacuum evaporation process, an HDP-CVD process, a printing process, etc.

A first electrode 140 may be formed on the second insulation layer 130.

A contact hole which exposes the drain area D of the thin film transistor TFT may be formed by partially etching the first and second insulation layers 120 and 130. And then, a second conductive material layer may be formed on the second insulation layer 130 to fill the contact hole. After that, a first electrode 140 may be obtained by patterning the second conducive material layer. Here, the second conductive material layer may be formed by a printing process, a sputtering process, a CVD process, a pulsed laser deposition ("PLD") process, a vacuum evaporation process, an atomic layer deposition ("ALD") process, etc.

A pixel defining layer 150 may be formed on the second insulation layer 130 including the first electrode 140 thereon.

The pixel defining layer 150 may be obtained by depositing a pixel defining material layer such as by a spin coating process, a spray process, a printing process, a CVD process, a PECVD process, an HDP-CVD process, etc. In exemplary embodiments, the pixel defining material layer may be partially etched to form an opening partially exposing the first electrode 140 and an opening corresponding to a window (refer to W of FIG. 1). The openings defined by portions of the pixel defining layer 150 may define a display region, a non-display region and a transmitting region of the transparent organic light emitting display apparatus.

A light emitting structure 160 may be formed on the first electrode 140 including the pixel defining layer 150 thereon.

The light emitting structure 160 may be formed on the first electrode 140 exposed by the opening defined by portions of the pixel defining layer 150. The light emitting structure 160 may be formed by a laser induced thermal imaging process, a printing process, etc.

A preliminary second electrode 170 may be formed on the light emitting structure 160, the pixel defining layer 150 and the second insulation layer 130.

The preliminary second electrode 170 may be formed by a printing process, a sputtering process, a CVD process, an ALD process, a vacuum evaporation process, a PLD process, etc.

In an exemplary embodiment, for example, the preliminary second electrode 170 may include material such as magnesium and/or silver, and a thickness of the preliminary second electrode 170 may be about 10 nm to about 13 nm.

Figure 5B:
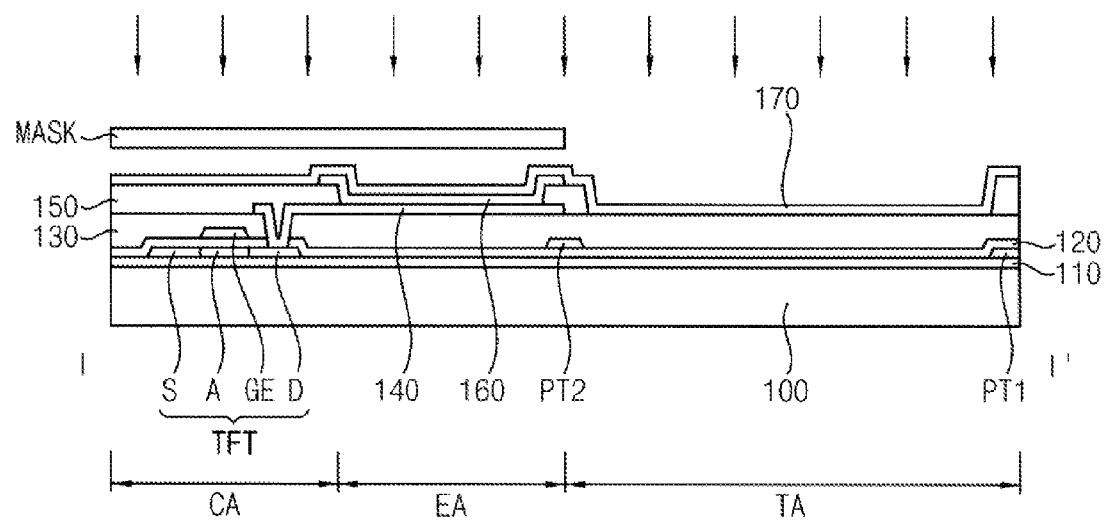
Figure 5C:
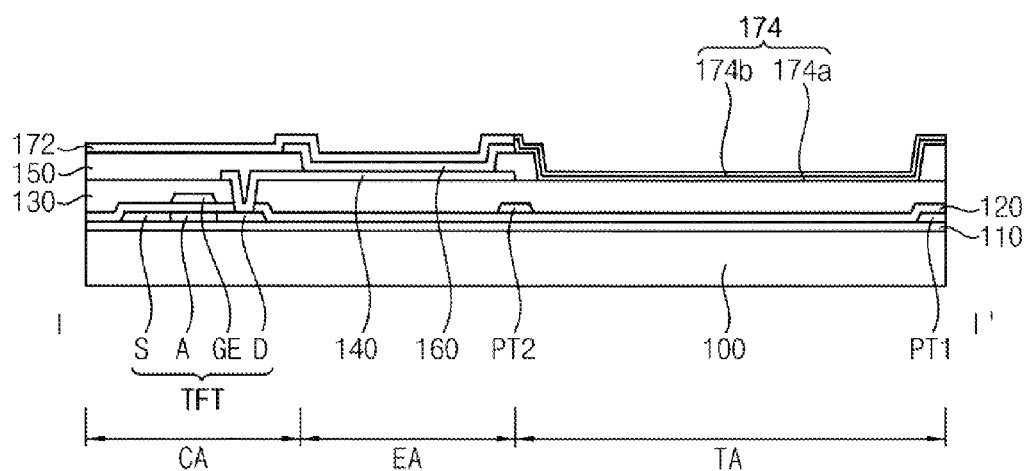

Referring to FIGS. 5B and 5C, a second electrode 172 and 174 may be formed by partially oxidizing the preliminary second electrode 170.

In exemplary embodiments, a mask MASK may be disposed on the preliminary second electrode 170 to cover a circuit area CA and a light emitting area EA. The mask MASK may be a fine metal mask ("FMM"). After that, an upper portion of the preliminary second electrode 170 which is not covered by the mask MASK and corresponds to a transmitting area TA may be oxidized such as by an oxygen plasma treatment (indicated by the downward arrows of FIG. 5B).

Here, the mask MASK may be disposed on the base substrate 100, and oxygen may be provided in a direction from top to bottom, so that the preliminary second electrode 170 may be oxidized. Thus, the above process may be performed with the base substrate 100 and layers formed thereon facing upward, such that the mask MASK is disposed above the collective display substrate including the base substrate 100 and the layers formed thereon. Thus, although a transparent organic light emitting display apparatus has an increased planar dimension, since the mask MASK is disposed above the display substrate and overlapping the circuit area CA and the light emitting area EA, failures due to deformation or sag of the mask MASK may be decreased.

Referring again to FIG. 5C, the second electrode may include a first portion 172 which corresponds to the circuit area CA and the emitting area EA and a second portion 174 which corresponds to the transmitting area TA.

The first portion 172 of the second electrode may include a metal. IN an exemplary embodiment, for example, the first portion 172 may include magnesium and/or silver, and a thickness of the first portion 172 may be about 10 nm to about 13 nm.

The second portion 174 of the second electrode may include a first layer 174a and a second layer 174b. The second layer 174b may be formed on the first layer 174a by oxidizing the upper portion of a material forming the second portion 174. The first layer 174a may not be oxidized by the oxidizing the upper portion of the material forming the second portion 174.

The second layer 174b may include a metal oxide. In an exemplary embodiment, for example, the second layer 174b may include magnesium oxide and/or silver oxide.

A total or maximum thickness of the first portion 172 may be substantially same as sum of thicknesses of the first and second layers 174a and 174b of the second portion 174.

Figure 5D:
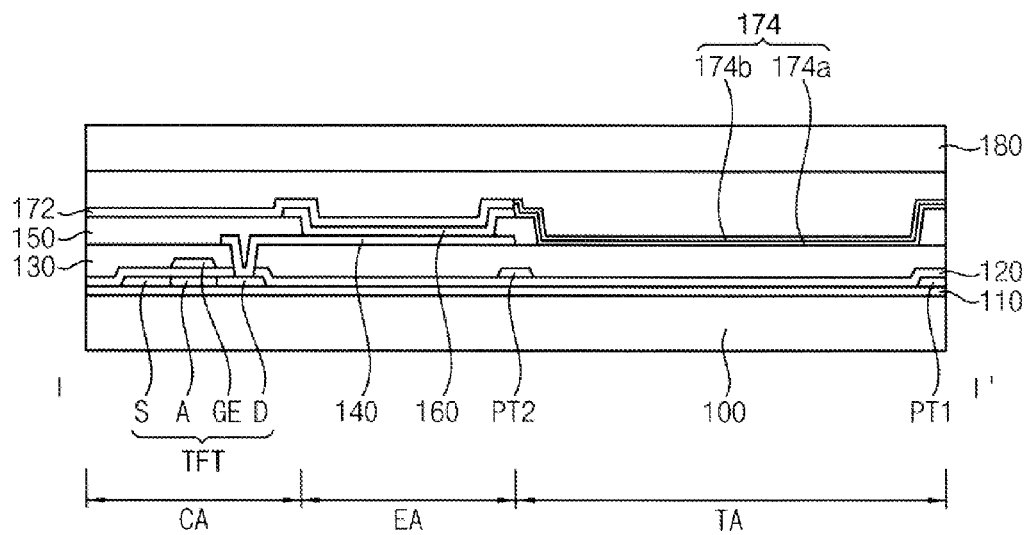

Referring to FIG. 5D, the second electrode 172 and 174 may be sealed from outside using the sealing substrate 180.

The sealing substrate 180 may include a transparent material, and may reduce or effectively prevent ambient air and moisture from permeating into the transparent organic light emitting display apparatus. The sealing substrate 180 may be combined with the base substrate 100 to seal a space between the base substrate 100 or layers of the transparent organic light emitting display apparatus disposed on the base substrate 100, and the sealing substrate 180, such as by a sealing agent (not shown).

Therefore, one or more exemplary embodiment of a transparent organic light emitting display apparatus according to the invention may include a second electrode disposed in a display area and a transparent (e.g., transmitting) area. The second electrode in the transmitting area may include a relatively higher oxygen content than that in the display area, so that transmittance of external light at the transmitting area may be improved.

In addition, in one or more exemplary embodiment of a method of manufacturing a transparent organic light emitting display apparatus, display area and transmitting area portions of a single, unitary second electrode material layer are simultaneously subjected to an oxidation process to improve the transmittance of external light through the transmitting area, so that a process of manufacturing the transparent organic light emitting display apparatus may be simplified and production yield may be improved.

One or more exemplary embodiment of the invention may be applied to an organic light emitting display device, and to an electronic device having the organic light emitting display device. In exemplary embodiments, for example, the invention may be applied to an electronic device such as a computer monitor, a television, a laptop, a digital camera, a cellular phone, a smart-phone, a smart-pad, a personal digital assistants ("PDA"), a portable multimedia player ("PMP"), an MP3 player, a navigation system, a videophone, etc.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A transparent organic light emitting display apparatus comprising:
 a base substrate;
 a first electrode disposed on the base substrate;
 a second electrode disposed on the first electrode; and
 a light emitting structure which is disposed between the first electrode and the second electrode,
 the second electrode comprising:
  a first portion which overlaps the light emitting structure and through which light from the light emitting structure is transmitted; and
  a second portion which is disposed adjacent to and non-overlapping the first portion and the light emitting structure, and through which external light passes,
 wherein an oxygen content of the second portion is different from that of the first portion.

2. The transparent organic light emitting display apparatus of claim 1, wherein the second electrode is disposed corresponding to an entire surface of the base substrate.

3. The transparent organic light emitting display apparatus of claim 1, further comprising a sealing substrate disposed on the second electrode, the sealing substrate configured to block ambient air and moisture from the second electrode.

4. The transparent organic light emitting display apparatus of claim 1, wherein
 the transparent organic light emitting display apparatus comprises a plurality of pixels by which an image is displayed,
 each pixel among the plurality of pixels comprises a transmitting area through which the external light passes and a light emitting area in which light is emitted to display the image,
 the second portion of the second electrode corresponds to the transmitting area, and
 the first portion of the second electrode adjacent to the second portion of the second electrode corresponds to the light emitting area.

5. The transparent organic light emitting display apparatus of claim 1, wherein
 the first portion of the second electrode overlaps the first electrode, and
 the second portion of the second electrode does not overlap the first electrode.

6. The transparent organic light emitting display apparatus of claim 5, wherein
 the second portion of the second electrode comprises more than about 0.1 wt % of oxygen, and
 the first portion of the second electrode comprises less than about 0.1 wt % of oxygen.

7. The transparent organic light emitting display apparatus of claim 6, wherein
 the second electrode comprises magnesium and/or silver, and
 the second portion of the second electrode comprises magnesium oxide and/or silver oxide.

8. The transparent organic light emitting display apparatus of claim 7, wherein a thickness of the second portion of the second electrode is substantially the same as a thickness of the first portion of the second electrode adjacent to the second portion of the second electrode.

9. The transparent organic light emitting display apparatus of claim 8, wherein the thickness of the second electrode is about 10 nanometers to about 13 nanometers.

10. The transparent organic light emitting display apparatus of claim 1, further comprising a pixel defining layer disposed overlapping the first electrode,
 wherein the pixel defining layer defines an opening in which the light emitting structure is disposed.

11. The transparent organic light emitting display apparatus of claim 10, wherein
 the opening defined by the pixel defining layer defines a window through which the external light passes, and
 the window defined by the opening defined by the pixel defining layer overlaps the second portion of the second electrode.

12. The transparent organic light emitting display apparatus of claim 11, further comprising a thin film transistor electrically connected to the first electrode, and
 wherein the pixel defining layer defining the opening overlaps the thin film transistor.

13. The transparent organic light emitting display apparatus of claim 1, wherein
 the second portion of the second electrode comprises:
  a first layer; and
  a second layer disposed on the first layer,
 the second layer disposed on the first layer comprises more than about 0.1 wt % of oxygen, and
 the first portion of the second electrode and the first layer of the second portion of the second electrode comprise less than about 0.1 wt % of oxygen.

14. The transparent organic light emitting display apparatus of claim 13, wherein
 the first portion of the second electrode and the first layer of the second portion of the second electrode comprise magnesium and/or silver, and
 the second layer of the second portion of the second electrode comprises magnesium oxide and/or silver oxide.

15. The transparent organic light emitting display apparatus of claim 14, wherein
 a total thickness of the first portion of the second electrode is about 10 nanometers to about 13 nanometers, and
 a sum of thickness of the first and second layers of the second portion of the second electrode is about 10 nanometers to about 13 nanometers.

16. A method of manufacturing a transparent organic light emitting display apparatus, comprising:
 forming a first electrode on a base substrate;
 forming a second electrode on the first electrode, the second electrode comprising:
  a first portion, and
  a second portion which is disposed adjacent to and non-overlapping the first portion;
 forming a light emitting structure between the first electrode and the second electrode; and
 oxidizing the second electrode to form an oxygen content of the second portion different from that of the first portion,
 wherein light is transmitted through the first portion and the second portion.

17. The method of claim 16, wherein
the second electrode comprises magnesium and/or silver, and
a thickness of the second electrode comprising magnesium and/or silver is about 10 nanometers to about 13 nanometers.

18. The method of claim 16, wherein
the first portion of the second electrode is not oxidized in the oxidizing the portion of the second electrode,
the second portion of the second electrode adjacent to the first portion of the second electrode is oxidized in the oxidizing the portion of the second electrode,
the second portion of the second electrode comprises more than about 0.1 wt % of oxygen, and
the first portion of the second electrode comprises less than about 0.1 wt % of oxygen.

19. The method of claim 16, wherein the oxidizing the portion of the second electrode comprises:
providing a mask on the second electrode on the base substrate, the mask exposing a portion of the second electrode; and
oxidizing the exposed portion of the second electrode with the mask on the second electrode on the base substrate.

20. The method of claim 19, wherein in the providing the mask, the mask is disposed on an upper surface of the base substrate.

* * * * *